United States Patent [19]

Pascucci

[11] Patent Number: 5,355,333
[45] Date of Patent: Oct. 11, 1994

[54] DYNAMIC REFERENCE SYSTEM FOR SENSE AMPLIFIER

[75] Inventor: Luigi Pascucci, Sesto S. Giovanni, Italy

[73] Assignee: SGS-Thomson Microelectronics, S.r.l., Agrate Brianza, Italy

[21] Appl. No.: 135,842

[22] Filed: Oct. 12, 1993

Related U.S. Application Data

[63] Continuation of Ser. No. 949,678, Sep. 22, 1992, abandoned.

[30] Foreign Application Priority Data

Sep. 26, 1991 [IT] Italy .............................. VA91 A 0034
Nov. 29, 1991 [IT] Italy .............................. VA91 A 0042

[51] Int. Cl.$^5$ .................................................. G11C 7/00
[52] U.S. Cl. ................... 365/189.01; 365/207; 365/210; 307/360; 307/530
[58] Field of Search ....................... 307/530, 360; 365/189.01, 189.09, 207, 208, 210

[56] References Cited
U.S. PATENT DOCUMENTS

| | | | |
|---|---|---|---|
| 4,543,500 | 9/1985 | McAlexander, III et al. ...... | 307/530 |
| 4,843,264 | 6/1989 | Galbraith ............................ | 365/207 |
| 5,117,394 | 5/1992 | Amin et al. ........................ | 365/200 |
| 5,218,570 | 6/1993 | Pascucci et al. .................. | 365/189.01 |

FOREIGN PATENT DOCUMENTS 237654  9/1987  European Pat. Off. .
326044  8/1989  European Pat. Off. .
514350 11/1992  European Pat. Off. .

OTHER PUBLICATIONS

Patent Abstracts of Japan, vol. 6, No. 212 (P-151)(1090) Oct. 26, 1982 & JP-A-57 117 180 (Toshiba) *abstract*.

*Primary Examiner*—Eugene R. LaRoche
*Assistant Examiner*—Tan Nguyen
*Attorney, Agent, or Firm*—Robert Groover

[57] ABSTRACT

A dynamic reference system for a sense-amplifier is implemented by using an asymmetric pair of transistors (one twice the size of the other) in the current paths between two selected sensing lines and a source of a bias current in order to superimpose an offset current to the currents forced through the loads of the two sensing lines. The asymmetric transistors may be driven by the signals which are generated by a pair of cascode circuits which are normally used to drive the load-connecting switches of the sensing network or by the signals present on the "other one" of the two sensing lines. This introduces a dynamic behavior of the reference system during an evaluation phase of a reading cycle which follows a first capacitance-charging phase, thus enhancing overall discrimination performances of the sense amplifier. The reference system is simple to implement and offers a number of advantages as compared to "static" reference systems of the prior art.

40 Claims, 9 Drawing Sheets

DYNAMIC REFERENCE SYSTEM FOR SENSE AMPLIFIER

This is a continuation of application Ser. No. 07/949,678, filed Sep. 22, 1992 abandoned.

BACKGROUND AND SUMMARY OF THE INVENTION

The present invention relates to programmable memory devices, and particularly to an improved reference system for a sense amplifier of a programmable memory device.

For ascertaining the state of an addressed cell of a matrix of memory cells, it is necessary to employ an appropriate reference system. A wealth of reference systems and sense amplifiers are known and described in the literature.[1] The sensing requirements of programmable memory devices (EPROMs, EEPROMs, flash EEPROMS, etc.) have some unusual features. Generally the known reference systems may be defined as static, i.e. having a constant behavior.

[1] See, e.g., the following U.S. Patents, all of which are hereby incorporated by reference: U.S. Pat. No. 5,132,576, Sense amplifier having load device providing improved access time; U.S. Pat. No. 5,109,187, CMOS voltage reference; U.S. Pat. No. 4,965,473, Eprom low voltage sense amplifier; U.S. Pat. No. 4,908,795, Semiconductor integrated circuit device with built-in memories; U.S. Pat. No. 4,903,237, Differential sense amplifier circuit for high speed ROMS, and flash memory devices; U.S. Pat. No. 4,813,018, Nonvolatile semiconductor memory device; U.S. Pat. No. 4,807,188, Nonvolatile memory device with a high number of cycle programming endurance; U.S. Pat. No. 4,785,423, Current limited EPLD array; U.S. Pat. No. 4,783,764, Semiconductor integrated circuit device with built-in memories, and peripheral circuit which may be statically or dynamically operated; U.S. Pat. No. 4,775,958, Semiconductor memory system. These materials not only provide some indication of alternative approaches to sensing, but also provide some examples of the variety of integrated circuit contexts in which the innovative sense amplifier can be used.

It is a requisite of the reference systems for reading memory cells to permit a correct discrimination within the briefest period of time possible, i.e. to promote a quick fanning out of the current characteristics of two branches of the reference circuit, one branch comprising a cell selected for reading and the other branch comprising a reference cell. Moreover, the reference system should ensure a correct discrimination also in the presence of a reduced threshold difference between a virgin cell and a programmed cell, in order to attain a higher reliability of the sensing circuit. This latter characteristic becomes especially important in the presence of so-called marginal bits (i.e. cells in which a weak programming operation and/or a combination of marginal cell parameters has produced a programmed cell exhibiting a non-null current).

In a prior U.S. patent application No. 07/878,823 (filed on May 4, 1992 by one of the present applicants and assigned to the same assignee and hereby incorporated by reference), a modulated current, offset type and a current unbalance type sense amplifier for programmable memory cells, which employ essentially identical load elements, are described. The differential sense amplifiers have cross-coupled load elements in order to implement also an output latch for storing an extracted datum. The description contained in that prior patent application is herewith incorporated by reference in its entirety.

The disclosed innovations provide a substantially "dynamic" reference system which offers definite advantages as compared with "static" reference systems of the prior art and which may be realized in a simpler way than more traditional systems.

In the presently preferred embodiment, a dynamic reference system for a sense-amplifier is implemented by using an asymmetric pair of transistors (one twice the size of the other) in the current paths between two selected sensing lines and a source of a bias current. This asymmetry adds an offset current to the currents forced through the loads of the two sensing lines. The asymmetric transistors may be driven by the signals which are generated by a pair of cascode circuits which are normally used to drive the load-connecting switches of the sensing network, or each may be driven by the signals present on the other of the two sensing lines. This introduces a dynamic behavior of the reference system during an evaluation phase of a reading cycle which follows a first capacitance-charging phase, thus enhancing overall discrimination performances of the sense amplifier. The reference system is simple to implement and offers a number of advantages as compared to "static" reference systems of the prior art.

The dynamic reference system of the invention preferably provides the capability for reading memory cells by creating a certain offset between a current forced through a first sensing line containing a reference cell and a current forced through a second sensing line containing a memory cell selected for reading of an input network of a differential sense amplifier. Each of the two lines is preferntially provided with an essentially identical load. A first high impedance amplifying stage, usually a cascode circuit has an input connected to the first line. A second high impedance amplifying stage, usually a cascode circuit has an input connected to the second line. Each of these amplifying stages generates on a respective output node a signal which is employed for driving at least a switch connected between the respective load and a bias current source, utilizing as a reference cell, in the first sensing line of the input network a cell in a non-conducting state. The dual signals generated on the respective output nodes are exploited by the two high impedance amplifying stages, usually a cascode circuits for superimposing (by use of a pair of asymmetric transistors which are functionally connected between the switches, respectively, and the bias current source and which essentially have a different size from one another,) an offset current to bias current flowing through the loads so The permits discrimination of the state of a cell selected for reading also in case of identity of the cell with the reference cell.

Essentially, the dynamic reference system of the presently preferred embodiment requires a line of selectable reference cells all in a non-conducting state. Therefore, if the memory employs cells connected in a NOR-configuration, the reference cells will all be "programmed" cells, and if the memory employs cells connected in a NAND-configuration, all the reference cells will be in a "virgin state."

In accordance with a first embodiment of the system of the invention, the two asymmetric transistors (having different sizes from each other) may be driven through their respective control (gate) terminals, by the signal which is present on the output node of the respective cascode circuit, or, in accordance with an alternative embodiment of the invention, the two asymmetric transistors may be driven by the signal which is present at the load node of the other sensing line. Moreover, for each of these two main embodiments, the circuit may be realized in various forms, as will be more fully described later.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
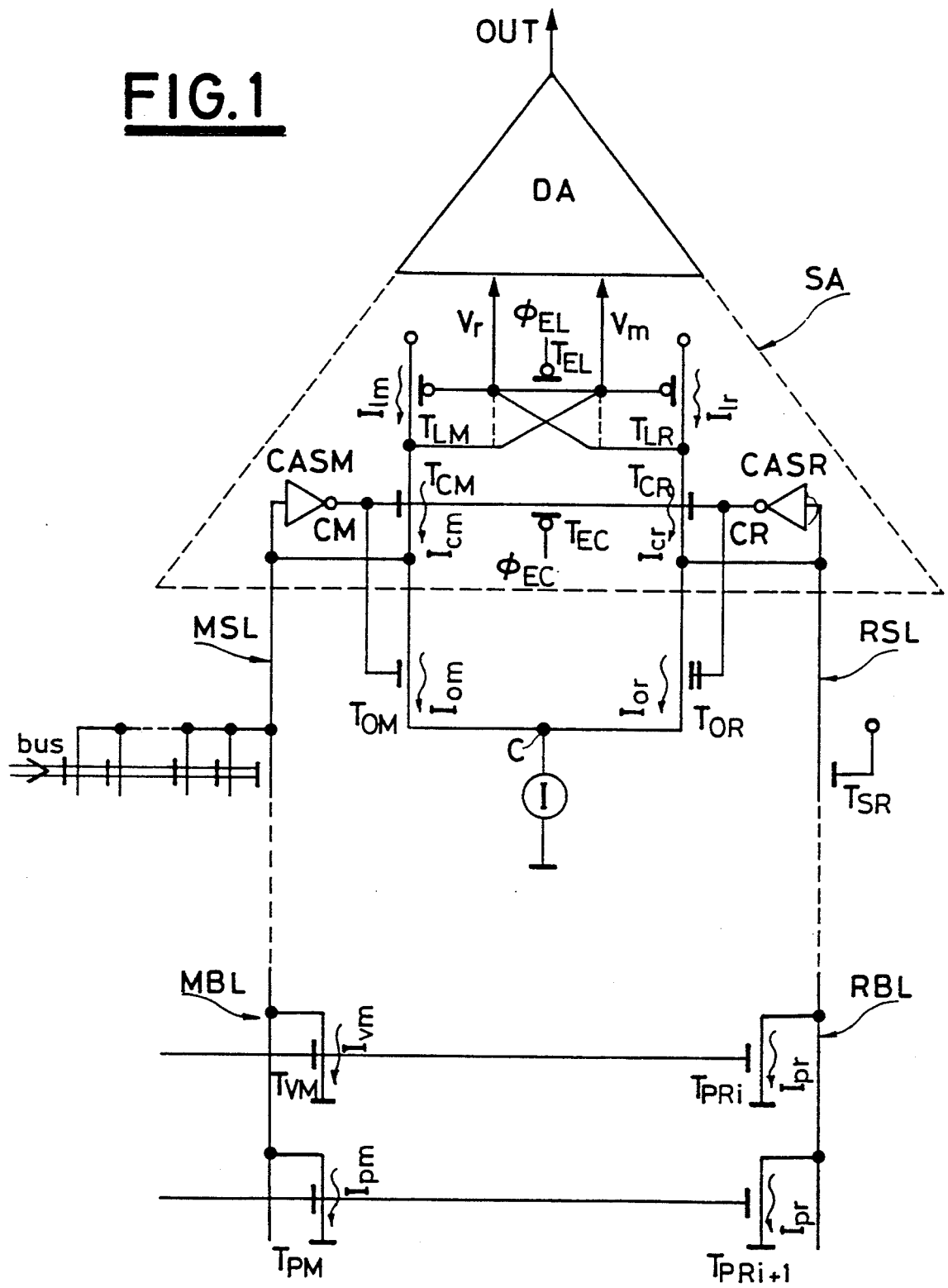
FIG. 1 is a circuit diagram of a reference system in accordance with a first embodiment of the present invention.

A schematic representation of the reference system of the presently preferred embodiment, emphasizing interactions of the reference system with a relative differential sense amplifier and indicates the relation of these elements to the general organization of the memory, is presented in FIG. 1.

Basically, the dynamic reference system of the presently preferred embodiment may be implemented by the use of:

A first transistor $T_{OM}$, functionally connected between a selected matrix's line MSL and a bias current source I and having a gate connected to the output node CM of a high impedance amplifying stage, usually a cascode circuit CASM of the matrix's side of the network. The size of the $T_{OM}$ transistor may be identical to the size of a corresponding switch $T_{CM}$, driven by the same matrix's side high impedance amplifying stage, usually a cascode circuit CASM, or it may be a multiple thereof according to an alternative embodiment shown in FIG. 7. Alternatively $T_{OM}$ may also be identical to a virgin, matrix cell $T_{VM}$, as in the embodiment of FIG. 5.

A second transistor $T_{OR}$, functionally connected between a reference line RSL and the bias current source I and having a gate connected to the output node CR of a high impedance amplifying stage, usually a cascode circuit CASR of the reference side of the network. Essentially, the size of the $T_{OR}$ transistor is different from the size of the first transistor $T_{OM}$. Indeed the size may be a multiple of the size of a corresponding switch $T_{CR}$, driven by the same reference side high impedance amplifying stage, usually a cascode circuit CASR, or identical thereto according to the alternative embodiment of FIG. 7. Alternatively, $T_{OM}$ may also be identical to a virgin matrix's cell ($T_{VM}$), as in the embodiment of FIG. 5.

Figure 5:
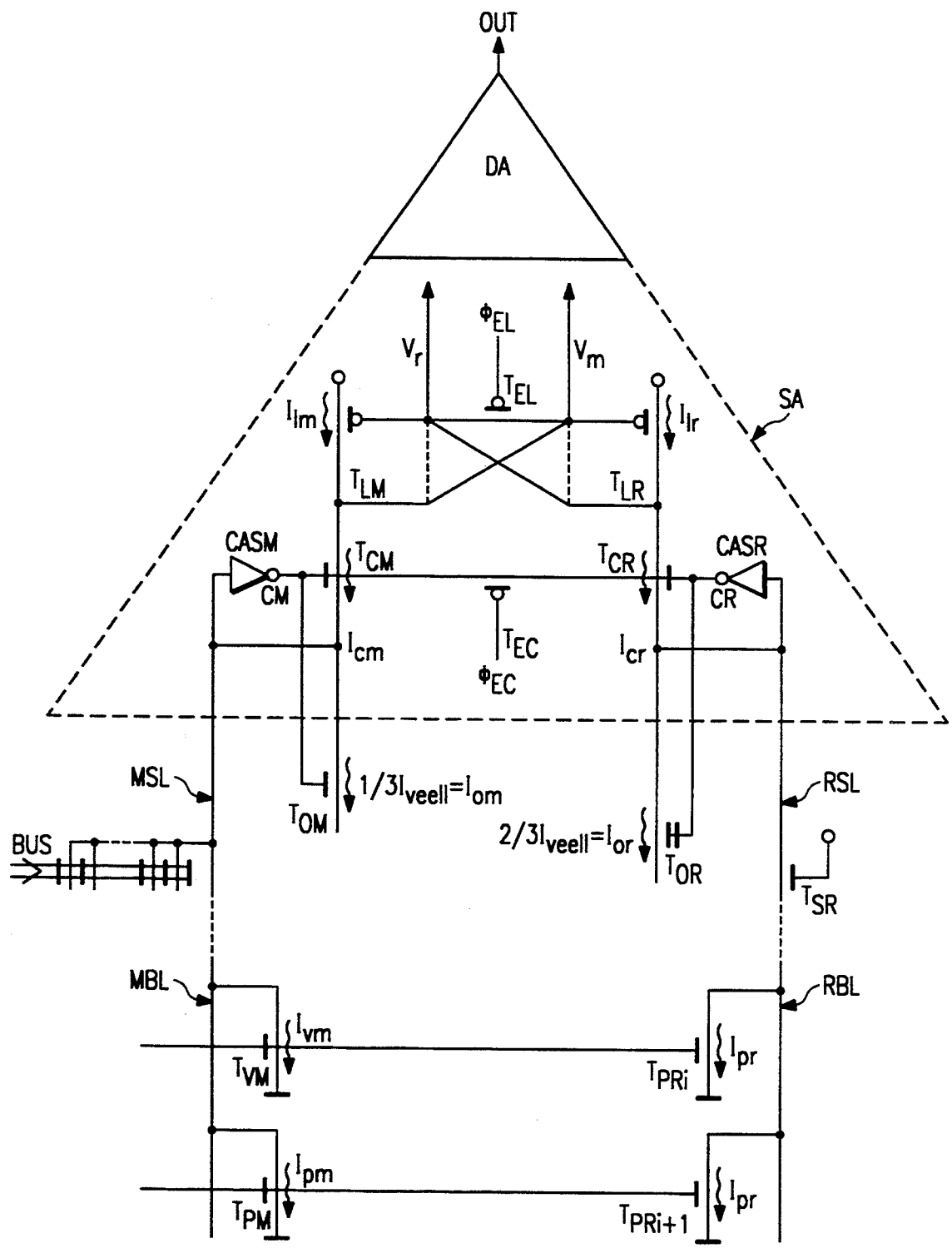
FIG. 5 shows an alternative embodiment of the reference circuit of the invention wherein the presence of a current generator as a bias current source is practically eliminated.
Figure 6:
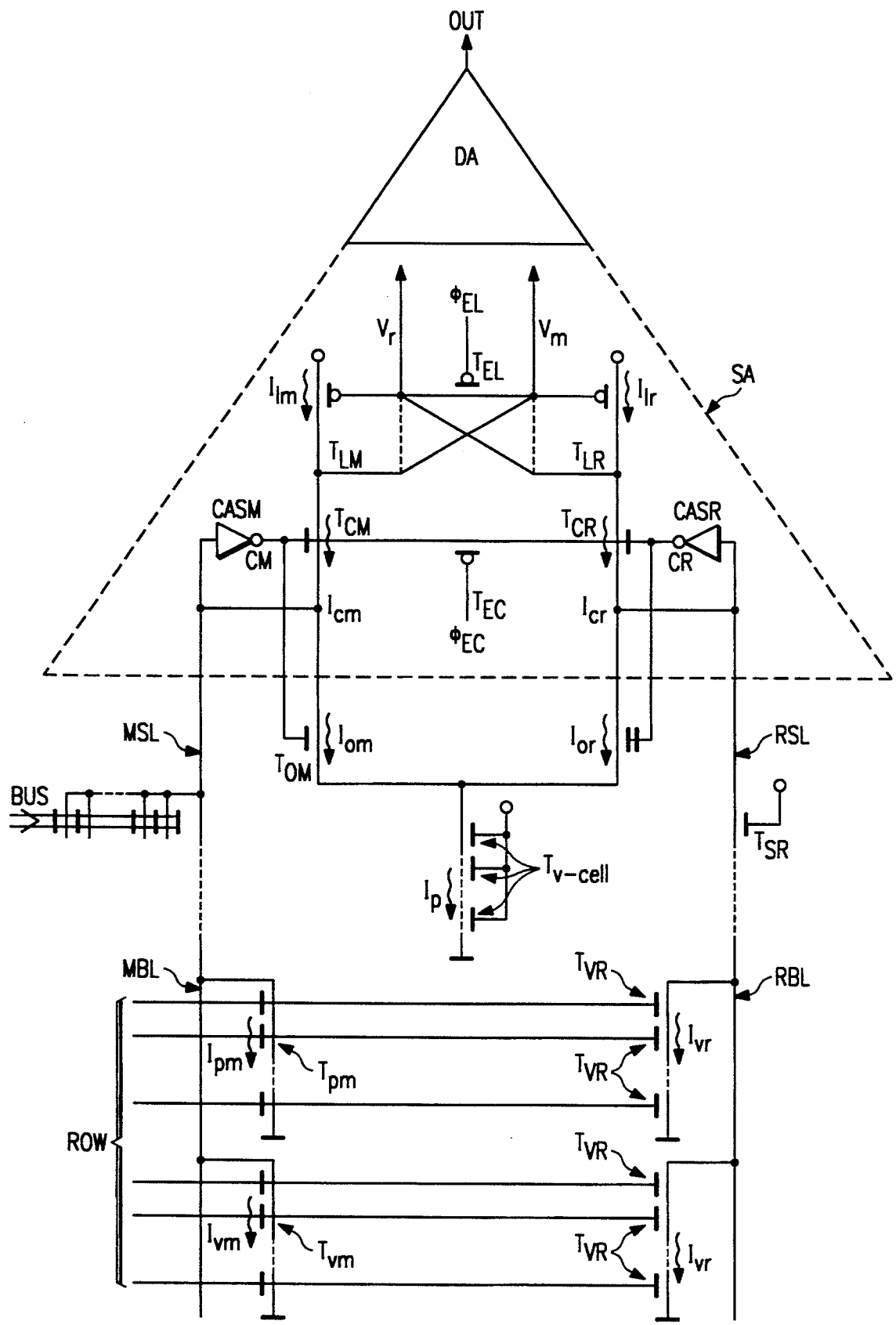
FIG. 6 is a further embodiment of the reference circuit of the invention for a memory wherein the cells are organized in a AND configuration.

A bias current source, which may be constituted by a dedicated current generator (I) connected between the sources connected in common of the transistors $T_{OM}$ and $T_{OR}$ and ground. Alternatively it may be constituted by the asymmetric transistors; $T_{OM}$ and $T_{OR}$, themselves, by having the respective sources connected to ground, as shown in FIG. 5. In any case, the current source must be capable of forcing a certain (I) current through the whole operating range of the circuit. Eventually such a dedicated current generator, according to the embodiments shown in FIG. 4 and 6, may be able to generate through the entire operating range of the reference circuit a current which may conveniently be identical to the current ($I_{cell}$) of a generic cell in a conducting condition (ON cell), (FIG. 4) or a current ($I_P$) identical to the current which passes through an AND parcel of cells (FIG. 6).

A RSL line (column) of reference cells containing essentially cells all in an non-conducting (OFF) condition. This means that the reference cells will all be "programmed" cells when the memory matrix is organized in a NOR configuration (FIG. 1). Conversely, all the reference cells will be all in a "virgin" state when the memory matrix is organized in an AND configuration (FIG. 6).

OPERATION OF THE REFERENCE CIRCUIT

With reference of the circuit of FIG. 1, the first phase of a reading cycle, known as address signals propagation phase, is a phase during which a precharging of all the capacitances which are associated to the two sensing lines selected for reading (i.e., the matrix line MSL and the reference line RSL) takes place, until the correct design bias conditions have been attained. At the end of this phase, the output nodes, CM and CR of the two "cascode" circuits CASM and CASR, after having set the two sensing lines selected for reading, MSL and MSR, in a correct working condition, assume a potential which is equal to about a threshold voltage (for example ($V_{TN}$) of an NMOS transistor) above the working potential attained by the sensing lines.

In these conditions the working potential of the two sensing lines MSL and MSR, is imposed also on the C node of the current generator (I).

For the following analysis, the following symbols will be used:

$I_{VM}$ current of a virgin matrix's cell $I_{PM}$ current of a programmed matrix's cell $I_{PR}$ current of a programmed reference cell $I_{OM}$ "offset" current produced by $T_{OM}$ on MSL $I_{OR}$ "offset" current produced by $T_{OR}$ on RSL
$I_{CM}$ current of the matrix-side "pass-transistor" $T_{CM}$
$I_{CR}$ current of the reference-side "pass-transistor" $T_{CM}$
$I_{LM}$ current of the matrix-side load $T_{LM}$
$I_{LR}$ current of the reference side load $T_{LR}$.

It is known that $I_{VM}=I$, because
$T_{OR}=2T_{OM}$ (sizewise)

The current of the bias current generator I splits as follows:
$I_{OR}=2I_{OM}$
$I_{OR}=(\frac{2}{3})I$
$I_{OM}=(\frac{1}{3})I$ The reference system leads to the following inequalities:

1) $I_{VM}+I_{OM}>I_{OR}$ for the case of an "ON" matrix's cell, and
2) $I_{OM}<I_{OR}$ for the case of an "OFF" matrix's cell.

Substituting values, this reduces to
1) $I+(\frac{1}{3})I>(\frac{2}{3})I$ for the case of an "ON" matrix's cell
2) $(\frac{1}{3})I<(\frac{2}{3})I$ for the case of an "OFF" matrix's cell.

The first member of these inequalities represents the current of the pass-transistor $T_{CM}$, while the second member represents the current of the other pass-transistor $T_{CR}$.

Figure 2:
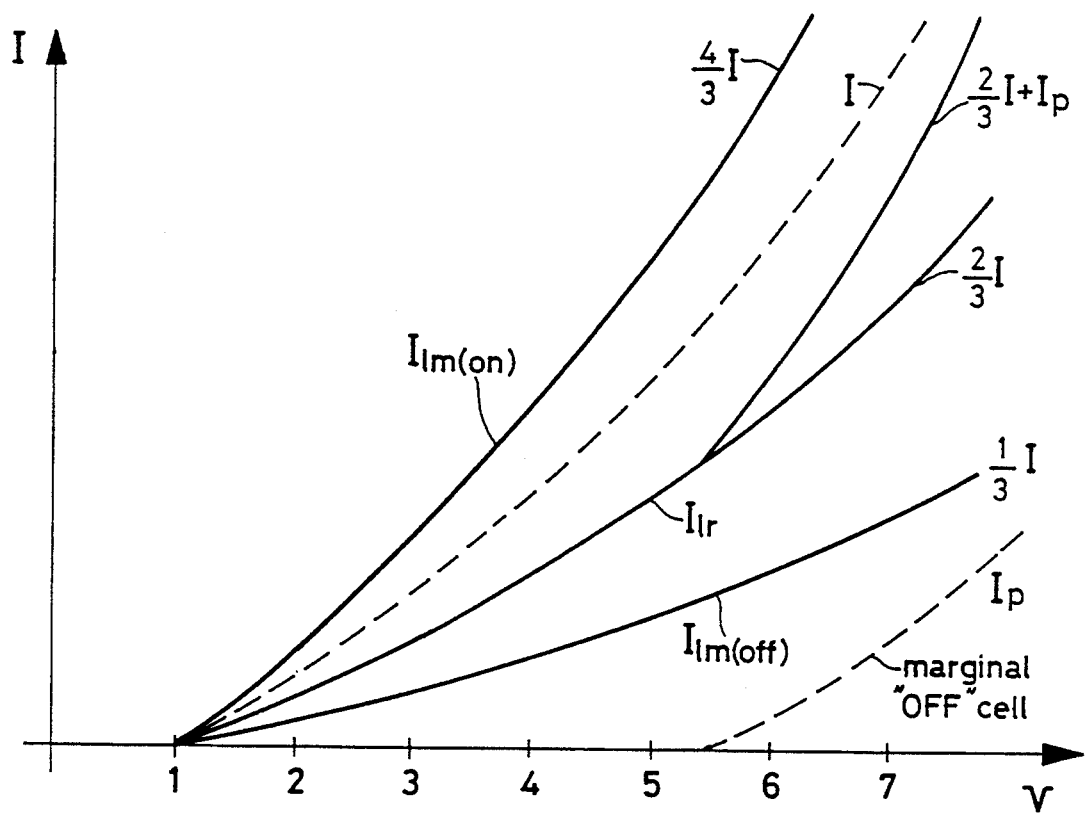
FIG. 2 is a diagram of the currents through the loads, and relative to the circuit of FIG. 1, and valid up to the evaluation instant.

This asymmetry of the two currents $I_{CM}$ and $I_{CR}$, at the two switches $T_{CM}$ and $T_{CR}$ as indicated above, is reflected on the loads: $T_{LM}$ and $T_{LR}$ (which may customarily be diode-configured transistors or, as in the case shown, they may be cross-coupled). Therefore, also the relative currents: $I_{LM}$ and $I_{LR}$, will be asymmetric in conformity with the above inequalities which are diagrammatically represented in FIG. 2.

Therefore the above system of inequalities controls the discrimination of a matrix's cell in an "ON" state from a matrix's cell in an "OFF" state.

As may be recognized from the two above-identified inequalities, the currents through the pass-transistors: $T_{CM}$ and $T_{CR}$, as well as through the respective loads: $T_{LM}$ and $T_{LR}$, are always reciprocally one double the other, depending on the state of the matrix's cell which is selected for reading.

However, because the output nodes of two cascode circuits CASM and CASR and the two loads $T_{LM}$ and $T_{LR}$ are equalized through the two equalization transistors Tec and Tel, respectively, no appreciable voltage difference may develop across the nodes CM and CR and $V_m$ and $V_r$.

Therefore, during the first phase of the reading cycle, the asymmetry is present only in terms of current levels.

Only when the two equalization transistors Tec, and Tel, are switched off by switching the respective control signals $\phi EC$ and $\phi EL$ (which may also be coincident), the potentials of the above mentioned nodes may evolve in a coherent manner in relation to the discrimination being performed.

The inactivation of the two above-mentioned equalization paths through Tec and Tel, besides initiating the enabling of the circuit for reading and storing a datum, initiates also a phase of "dynamical" behavior of the reference system which, through an asymptotic evolution of the conditions attained by the reference system during the first phase of the reading cycle, enhances the gain and speed of the "sense-amplifier", and increases its immunity to noise.

Figure 3:
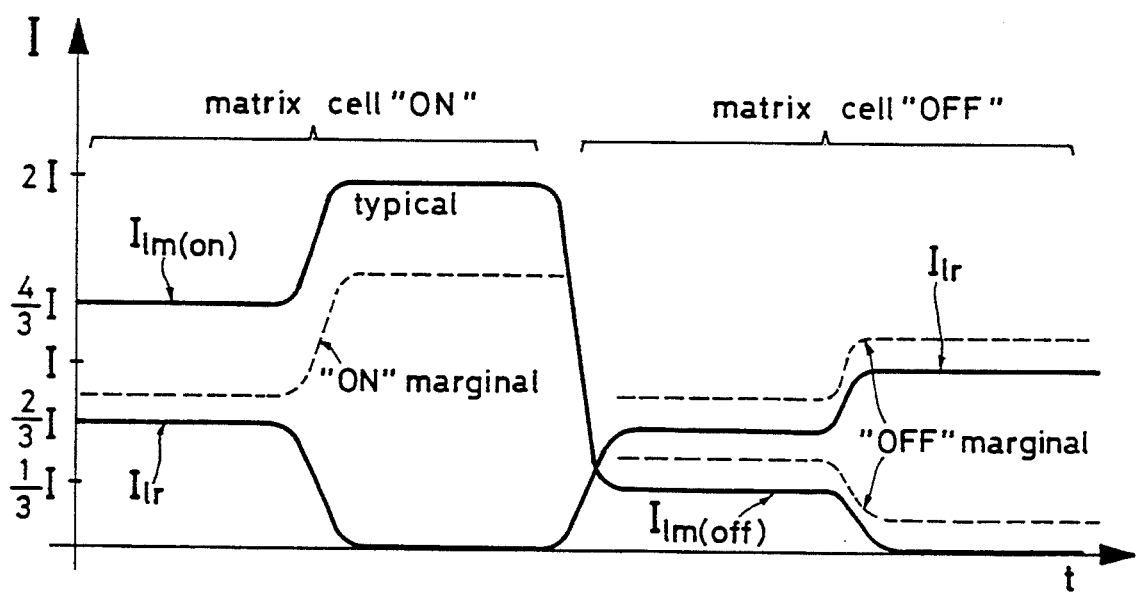
FIG. 3 is a "dynamic" diagram of the currents through the loads of a reference circuit of the invention which describes the way the currents evolve starting from the evaluation instant.

The diagrams of FIG. 3 depict the evolution of the currents through the loads starting from an initial asymmetry (built-up by the reference system) to a complete asymptotic evolution, for the two possible cases.

In fact, the phase-opposition dynamic behavior of the two cascode circuits CASM and CASR, acting through the nodes CM and CR, determines a switching of the "off-set" currents $I_{OM}$ and $I_{OR}$, from a condition of current sub-division between the two sensing lines of the reference network in terms of the preestablished ratio $(\frac{1}{3})I$ and $(\frac{2}{3})I$, to a condition of full current value (I) which is advantageously redirected through the most conductive one of the two lines.

As a consequence the two controlling inequalities are transformed as follows:

1) $I_{VM}+I_{OM}>I_{OR}$ for the case of an "ON" matrix's cell
2) $+I_{OM}>I_{OR}$ for the case of an "OFF" matrix's cell.

This reduces to
1) $I+I>0$ for the case of an "ON" matrix's cell, and
2) $O<I$ for the case of an "OFF" matrix's cell.

This represents a pair of stronger conditions than the ones applicable during the first phase of the reading cycle.

Such a "dynamic" evolution progresses towards the asymptotes, relative to the initial conditions, determined by the reference system of the invention. This is particularly advantageous for those cells ("marginal" cells) which behave somewhat weakly as compared with normal cells in the respective state.

For these marginal cells:
$I_V<I_{V\text{-}typ}$ for the case of a partially "ON" matrix's cell
$I_P>I_{P\text{-}typ}$ for the case of a partially "OFF" matrix's cell
where:
$I_{V\text{-}typ}$ is the typical current of a virgin cell, and
$I_{P\text{-}typ}$ is the typical current of a programmed cell.

The response of a "sense-amplifier" to these situations is usually markedly slower than in a normal situation and the slowing down is more marked the greater is the difference from ideal behavior of these cells. Moreover, in these situations, the sense amplifier becomes more sensitive to noise because the levels of current in the two sensing lines get closer to each other and therefore are less discernible.

The above described dynamic behavior of the reference network of the invention, by providing for a greater separation between the values of the currents built up by the reference system during the evaluation phase of reading cycle, improves the conditions of discrimination and therefore makes the response of the sense amplifier more uniform.

By virtue of its intrinsic characteristics, the reference system of the invention does not exhibit saturation phenomena. It remains always congruent with the generic current value of a cell and therefore remains valid both at low and at high of the supply voltage level.

Another advantage of the disclosed reference system is that of being auto-compensating.

Usually, in fact, weak programmings (e.g. programmed cells exhibiting a non-null current) produce a so-called marginal behavior of the memory, upon approaching the highest levels of the voltage supply range because of an intersecting of the "reference" curve with the current characteristics of a programmed cell.

The novel reference system, by employing reference cells in an OFF state only in the reference column (line), completely compensates the second inequality,) which may be rewritten as:

$I_{P+IOM}<I_O+I_P$ for the case of an "OFF" matrix's cell which, as may be observed, remains unaltered.

Indeed, when the comparison is carried out with a virgin cell, this compensation is not equally effective because the $I_P$ component does not appear in the first member of the relevant inequality:

$I_{VM}+I_{OM}>I_{OR}+I_P$ for the case of an "ON" matrix's cell

This reduces to $(4/3)I>(\frac{2}{3})I+I_P$ for an "ON" cell; nevertheless the condition:

$$(\frac{2}{3})I>I_P$$

which is arrived at by elaborating the preceding inequality, substantially remains always verified, because:

a) the $I_P$ component (when present) manifests itself only at relatively high values of the operating supply voltage range;

b) the disturbance created by $I_P$ could be significant only if it should coincide with a selection of a programmed cell (however it has been already seen that in such a case the disturbance is completely compensated);

c) the value $(\frac{2}{3})I$ may be reached only for values far off the normal supply ranges of memory devices and in any case, the condition $(\frac{2}{3})I$ is much stronger than the dual condition: $(\frac{1}{2})I$ which occurs in the sensing circuits of the prior art.

Moreover, the improved conditions of discrimination which are implemented by the novel reference system tolerate a reduced threshold difference between a virgin cell and a programmed cell, as clearly emerges from the preceding considerations.

The advantages in terms of reliability and simplification of the fabrication process are evident.

In defining the inequalities which characterize the behavior of the reference system of the invention according to this second embodiment the use of a current generator capable of delivering a whole offset current equal to $I_{OR}+I_{Of}$ equal to the current of a generic virgin cell $I=I_V$) has been hypothesized.

Such a value may be modified according to need in order to alter the relations between the "reference" curve and the respective characteristics of an ON cell and of an OFF cell.

For example if an equilibrium condition is set for $I_{OM}+I_{OR}=(3/2)I$, the system of inequalities becomes:

$I+(\frac{1}{2})I>I$ for the case of an "ON" matrix's cell
$(\frac{1}{2})I<I$ for the case of an "OFF" matrix's cell.

These values equal the separation between the characteristics of an ON and an OFF cell and the "reference" (comparison) curve (i.e. a typical characteristic curve of a reference system of a known type). Or, if:

$$I_{OM}+I_{OR}=(\frac{3}{4})I$$

the inequalities become:

1) $I+(\frac{1}{4})I>(2/4)I$ for the case of an "ON" matrix's cell

2) $(\frac{1}{4})I<(2/4)I$ for the case of an "OFF" matrix's cell

These values separate more markedly the characteristic of an ON than that of an OFF cell from the reference (comparison) curve. As a consequence the useful region for ON cells is virtually expanded while the useful region for OFF cells is virtually compressed.

In this manner, it is possible to "follow" the progress of the fabrication technology, by widening the useful region relative to a cell condition under which the process spread of electrical parameters is more critical. The advantage is the opportunity of optimizing the yield of relatively critical (high density) fabrication processes.

CIRCUIT MODIFICATIONS

Figure 4:
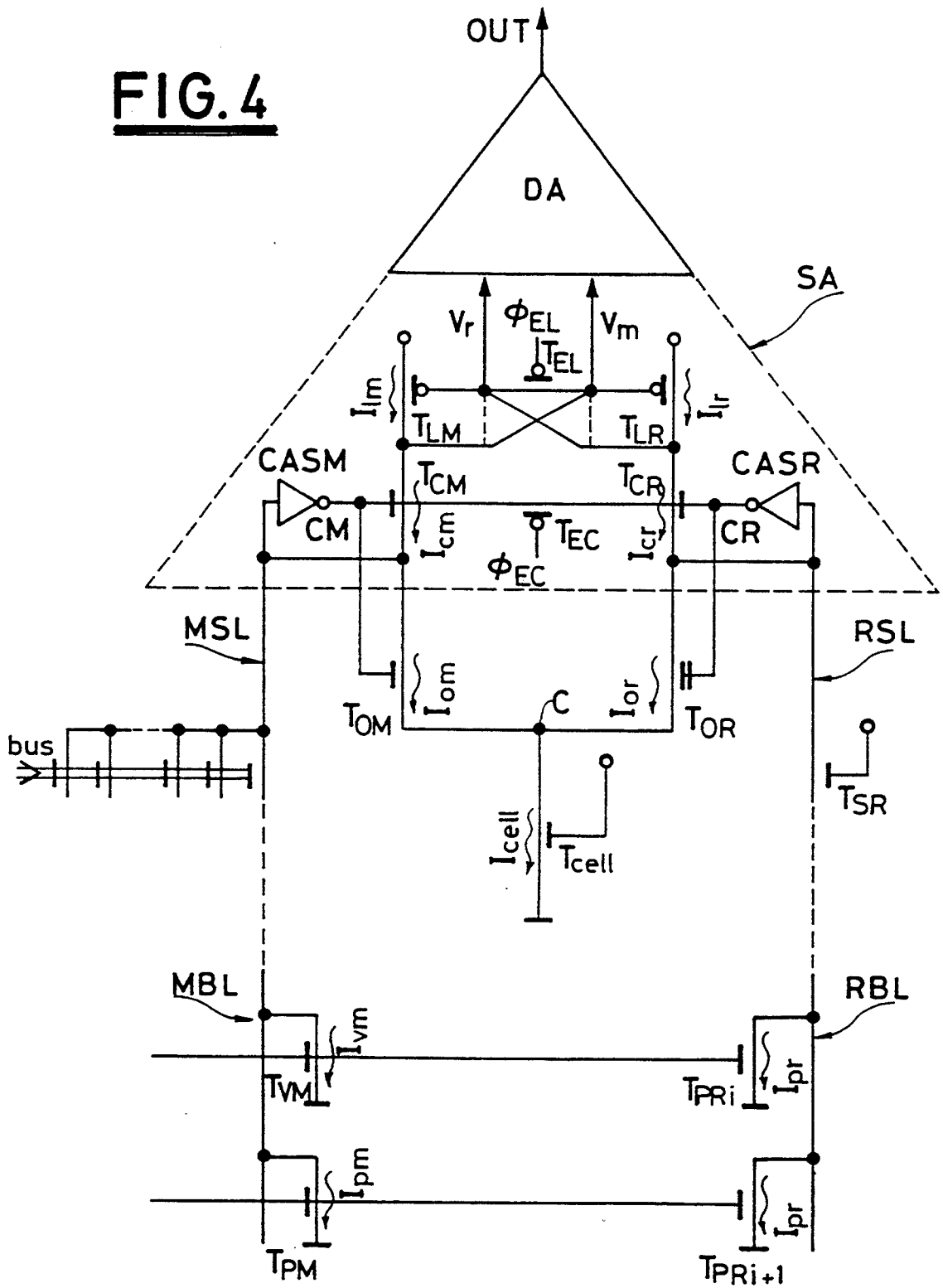
FIG. 4 show a simple embodiment of a bias current generator in a context of a memory wherein the cells are organized in a NOR configuration.

An embodiment of a bias current generator is suitable in a context of a NOR-configured memory matrix depicted in FIG. 4. The generator is simply made by utilizing a device similar to a generic virgin cell (T cell), having a gate connected to Vcc. In these conditions, the generated current is exactly identical to the current $I_V$ of a selected matrix's virgin cell. The system of inequalities describing the discrimination conditions is identical to the one discussed above.

An alternative simplified embodiment of the reference circuit is depicted in FIG. 5. According to this particular embodiment, the need for realizing a bias current generator is in practice eliminated, by simulating the effect by the use of the asymmetric transistors: $T_{OM}$ and $T_{OR}$, themselves. According to this embodiment, one of the two asymmetric transistors will necessarily have dimensions identical to those of a generic transistor constituting a virgin matrix's cell, while the other of the two asymmetric transistors will have dimensions multiple of the dimensions of the first transistor. In this way, it is in fact possible to replicate the characteristics of the reference system already described in relation to the embodiment depicted in FIG. 1. In fact, it will be simply necessary to establish a condition of operation such that the two cascode circuits: CASM and CASR, have their respective nodes CM and CR at such a voltage as to make the offset currents provided by the asymmetric transistors: $T_{OM}$ and $T_{OR}$, equal to: $(\frac{1}{2})$ I and $(\frac{2}{3})$ I, respectively.

By calling:

Vc=voltage at the nodes CM and CR, and

Vsl=voltage of the sensing lines MSL and RSL; the condition to be satisfied may be deducted from the following system of inequalities:

$I=k'[(Vcc-Vt)Vsl+(\frac{1}{2})Vsl^2]$ (current of a matrix's virgin cell)

$I_{OM}=k'[(Vc-Vt)Vsl+(\frac{1}{2})Vsl^2]$ (current of an off-set virgin cell) $3I_{OM}=I$.

FIG. 6 shows an embodiment of the reference system for a memory with cells organized in a AND configuration.

It should be stressed that in such an application are the programmed cells are in a conducting (ON) condition and, vice versa, the virgin cells are non-conducting (OFF). Therefore, the AND parcels of the reference line are all composed of virgin cells, as well as the parcel which acts as a bias current generator.

After having introduced due adaptations for this alternative type of configuration, the above-mentioned system of inequalities will permit discrimination while retaining its fundamental advantageous characteristics.

The solutions which have been illustrated so far are particularly suited for non-volatile ROM memories, wherein programming is effected by technological means (i.e. during fabrication).

Figure 7:
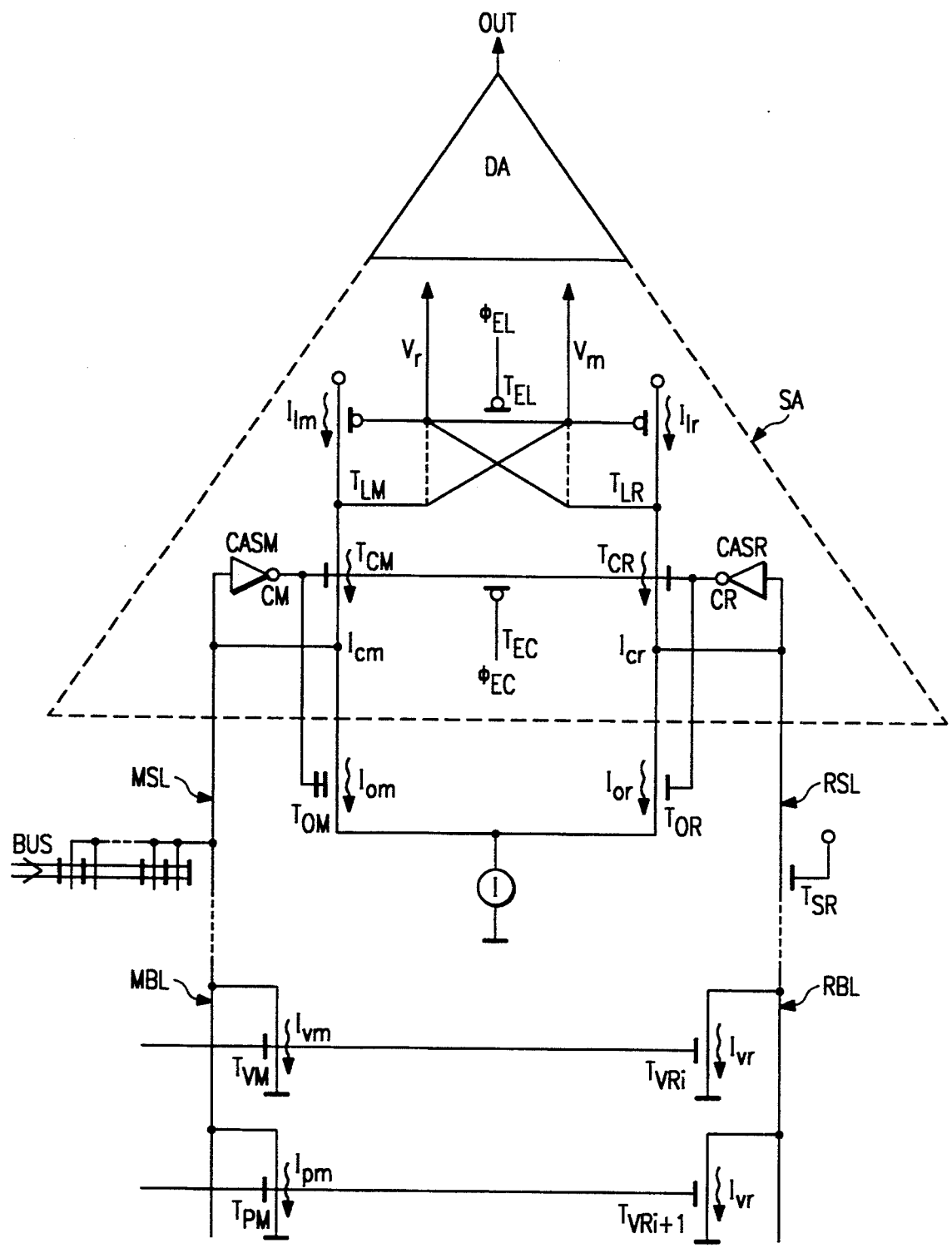
FIG. 7 is another alternative embodiment of the reference circuit of the invention.

In the case of EPROM or FLASH-EPROM memories, there may be a difficulty in programming a column of reference cells, but such a difficulty may be overcome by making the cells of these reference columns conducting (in general using virgin cells) and inverting, as depicted in FIG. 7, the geometric relationship between the two transistors: $T_{OM}$ and $T_{OR}$, i.e. by making $T_{OM}=2T_{OR}$.

In such a configuration, if the current generator is implemented to deliver a current equal to (3/2)I, the following system of inequalities may be set up:
$I + I_{OM} > I + I_{OR}$ for the case of an "ON" matrix's cell,
$I_{OM} < I + I_{OR}$ for the case of an "OFF" matrix's cell.
With $I_{OM} = 2I_{OR} = I$ we reach the following conditions:
$I + I > I + (\frac{1}{2})I$ for the case of an "ON" matrix's cell
$I < I + (\frac{1}{2})I$ for the case of an "OFF" matrix's cell
which permits discrimination as described before. Of course, also in this context, the bias current generator may be modified for optimizing the reference system.

A similar alternative embodiment of the circuit of FIG. 1, wherein the transistor $T_{OM}$ has a size which is a multiple of the size of the transistor $T_{OR}$, is depicted in FIG. 7.

Figure 8:
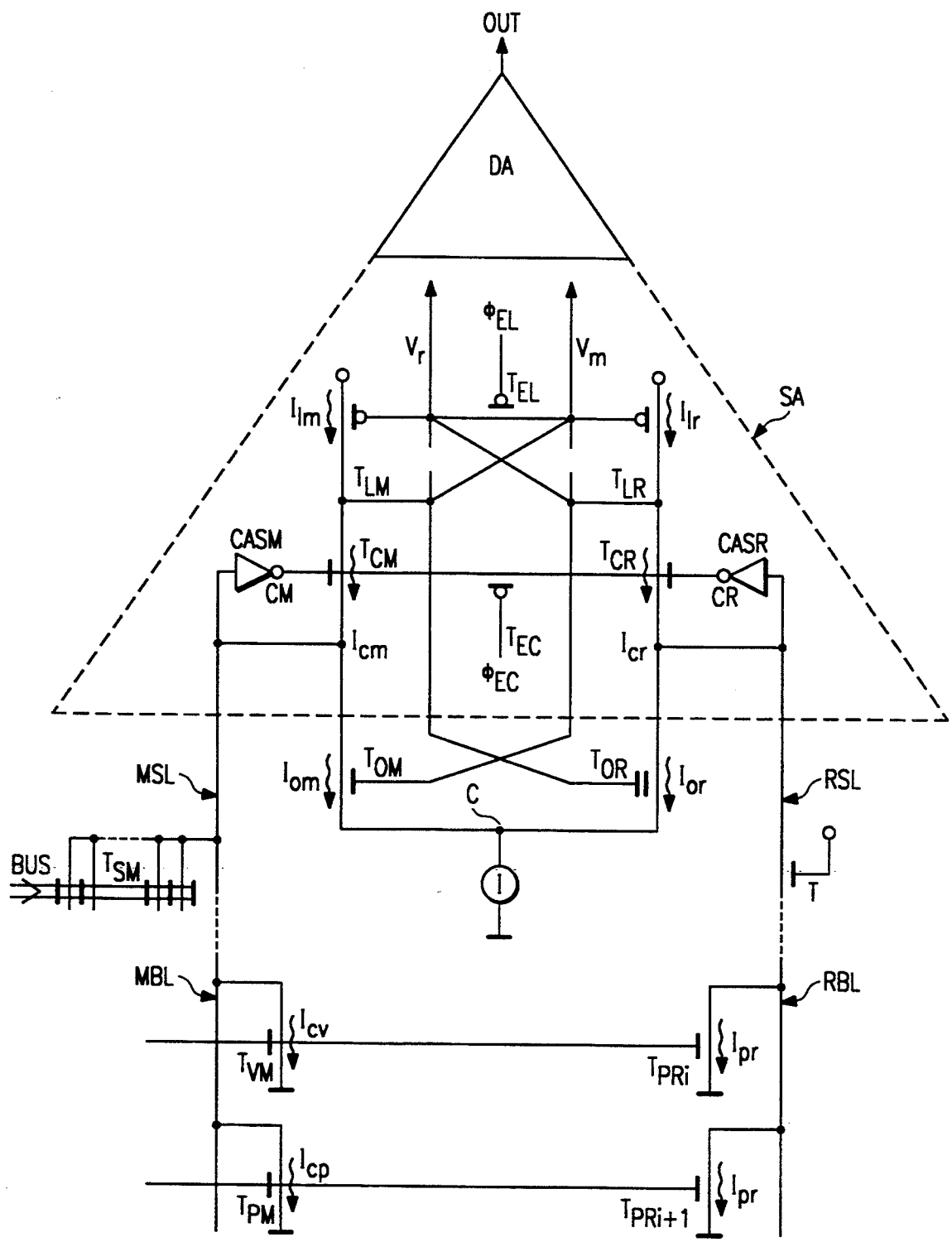
FIG. 8 shows a reference circuit made in accordance with an alternative embodiment of the present invention.
Figure 10:
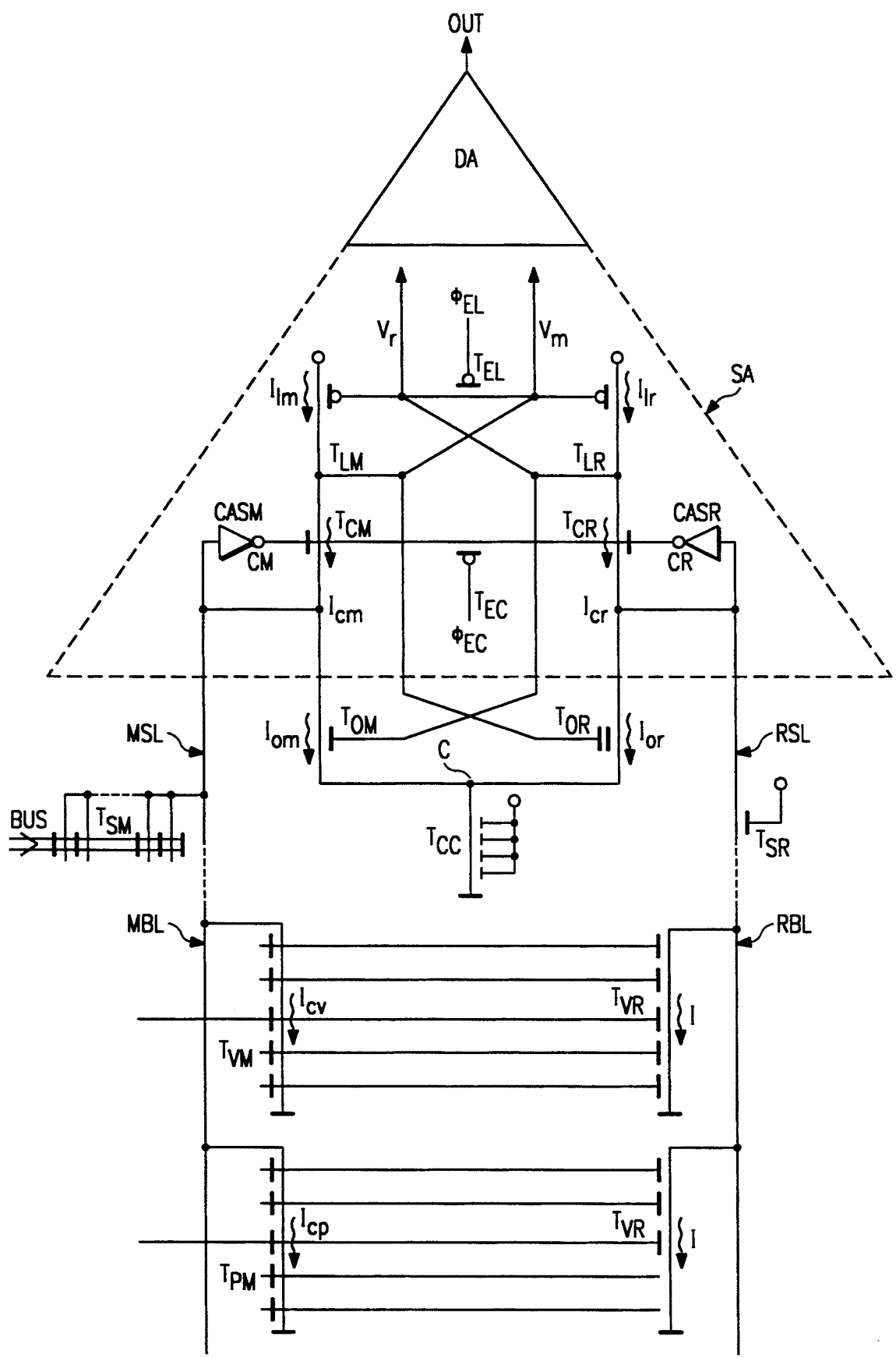
FIG. 10 is a different embodiment of the circuit of FIG. 8, wherein the cells are organized in a NAND configuration.

Further alternative embodiments of the reference system of the invention are depicted in FIG. 8, for the case of a memory with cells connected in a NOR configuration, and in FIG. 10, for the case of a memory wherein the cells are connected in a AND configuration.

Differently from the embodiments described in relation with FIGS. 1, 4, 5, 6, and 7, according to these further embodiments of FIG. 8 and 10, the two asymmetric transistors $T_{OM}$ and $T_{OR}$, instead of being driven, through their respective control (gate) terminal, by the signal which is present on the output node (CM and CR) of the respective cascode circuit (CASM and CASR), are driven instead by the signals which are present on the matrix's and on reference sensing lines themselves, by connecting the gate of the transistor $T_{OM}$ to the reference line RSL and the gate of the transistor $T_{OR}$ to the matrix line MSL or, in other words, to the respective loads: $T_{LR}$ and $T_{LM}$ of the two sensing lines. The potentials (at the load level) of the two selected sensing lines take a certain value in function of the current which passes through the respective line, which in turn depends from the state (ON-OFF) of the selected cell. As a consequence, the offset currents which are produced by the two asymmetric transistors $T_{OM}$ and $T_{OR}$ will reflect such a difference. This means that when on the matrix's side an "ON" cell is selected, the currents of the two asymmetric transistors will be lower than when an "OFF" cell is selected. This offers the advantage of determining a reduced influence of the offset current on the total current of the reference system upon an increase of the cell current and, vice versa, an enhanced effect upon a decrease of the cell current. This fact greatly increases the discrimination abilities of the reference system, as will be explained in more detail later.

OPERATION OF THE REFERENCE CIRCUIT ACCORDING TO THE ALTERNATIVE EMBODIMENTS OF FIGS. 8 AND 10.

With reference to the circuit of FIG. 8, at the end of a first phase of a reading cycle, known as signal propagation phase, or as a precharging phase for all capacitances which are associated to the two lines (i.e. the matrix's line and the reference line) selected for reading until attaining correct bias conditions, the output nodes, CM and CR of the two cascode circuits; CASM and CASR, after having set the two lines selected for reading, MSL and MSR, in a correct working condition, eventually assume a potential which is equal to about a threshold voltage (VTN) of a MOS transistor (e.g. an n-channel transistor) above the attained working potential of the selected lines.

At the end of this first phase, the equalization transistors (Tee and Tel) are still conducting and therefore:[2]

[2] Additional terms used here include: $I_L$ = current pertaining to a load $I_{LV}$ = current of the loads when a virgin cell is selected $I_{LP}$ = current of the loads when a programmed cell is selected $I_C$ = current pertaining to a selected cell $I_{CV}$ = current of a selected virgin cell $I_{CP}$ = current of a selected programmed cell $I_O$ = offset current pertaining to each asymmetric transistor $T_{OM}$–$T_{OR}$ $I_{CV}$ = offset current relative to a selected virgin cell $I_{OP}$ = offset current relative to a selected programmed cell.

$V_R = V_V$ $I_L = I_{LV}$ if an ON cell is selected $V_R = V_P$ $I_L = I_{LP}$ if an OFF cell is selected and $V_P > V_V I_{LV} > I_{LP}$ Moreover, the following fundamental equation still holds:

$2I_L = I_C + 3I_O$ from which the following equations may be derived:

$2I_{LV} = I_{CV} + 3I_{OV}$ if an ON cell is selected $2I_{LP} = I_{CP} + 3I_{OP}$ if an OFF cell is selected where:

because generally: $I_{CP} = 0$.
Given: $I_{CV} = I$
it follows that:
$2I_{LV} = I + 3I_{OV}$ if an ON cell is selected
$2I_{LP} = 3I_{OP}$ if an OFF cell is selected.
Thence, by solving for $I_O$:

$I_{OV} = (\frac{2}{3})I_{LV} - (\frac{1}{3})I$ if an ON cell is selected $I_{OP} = (\frac{2}{3})I_{LP}$ if an OFF cell is selected From these two last equations, it may be deducted that the offset current $I_O$ is a reciprocal function of the cell current: when $I_C$ rises, the offset current $I_O$ drops progressively in a ratio of ($\frac{1}{3}$) of $I_C$ from initial value of ($\frac{2}{3}$)$I_L$ (a condition valid when $I_C = 0$).

In other words, the influence of the offset current on the global current of the reference system diminishes with an increase of the cell current while increases when the cell current decreases.

This improves the performance of the reference system, as will be explained later.

In view of the fact that the following equation may be written:

$I_{OP} - I_{OV} = (\frac{2}{3})I_{LP} - (\frac{2}{3})I_{LV} - (\frac{1}{3})I_{CV})$ and since $I_{OP} - I_{OV} = (\frac{2}{3})I_{LP} - (\frac{2}{3})I_{LV} = (\frac{1}{3})I$ it may be derived that:

$I_{LP} < I_{LV}$ $I_{OP} - I_{OV} < (\frac{1}{3})I$

In any case, the two offset values are separated by less than ($\frac{1}{3}$)I.

Similarly, for the currents through the loads, the following dual condition is verified:

$$I_{LV} - I_{LP} < (\tfrac{1}{3})I$$

The currents of the loads as well as of the offset transistors may vary by less than $(\tfrac{1}{3})I$.

The equilibrium condition is given by the equation:

$$I_C + I_O = 2I_O$$

If the elements are sized so that such an equilibrium condition is reached when:

$$I_C = I_{CV}/2 = \tfrac{1}{2}$$

then the following equation is verified:

$$I_O = I_{CV}/2 = \tfrac{1}{2}$$

and because:

$$2I_L = I_C + 3I_O$$

by substituting the following is obtained:

$$I_L = I_V = I$$

Therefore, by such a criterion, the load current ($I_L$) is double the corresponding offset current. The reference system revolves about this basic condition and presents the following characteristics:

$$I_{OV} < I_{CV}/2 < I_{OP} < - > I_{OV} < \tfrac{1}{2} < I_{OP}$$
$$I_{LP} < I_{CV} < I_{LV} < - > I_{LP} < I < I_{LV}$$
$$I_{OP} - I_{OV} < (\tfrac{1}{3})I_{CV} < - > I_{OP} - I_{OV} < (\tfrac{1}{3})I$$
$$I_{LV} - I_{LP} < (\tfrac{1}{3})I_{CV} < - > I_{LV} - I_{LP} < (\tfrac{1}{3})I$$

These properties, besides permitting the implementation of an operative reference system, produce an advantageous enhancement of the (current) signal difference as compared to the one which is obtained with a reference system of the prior art.

In fact, the condition which allows discrimination of the cells, may be synthesized as follows:

$$I_C + I_O > < 2I_O$$

from which, for the instant reference system, the following inequalities may be derived:
$I_{CV} + I_{OV} > 2I_{OV}$ if an ON cell is selected
$I_{OP} < 2I_{OP}$ (typically being $I_{CP} = 0$) if a OFF cell is selected.

Figure 9:
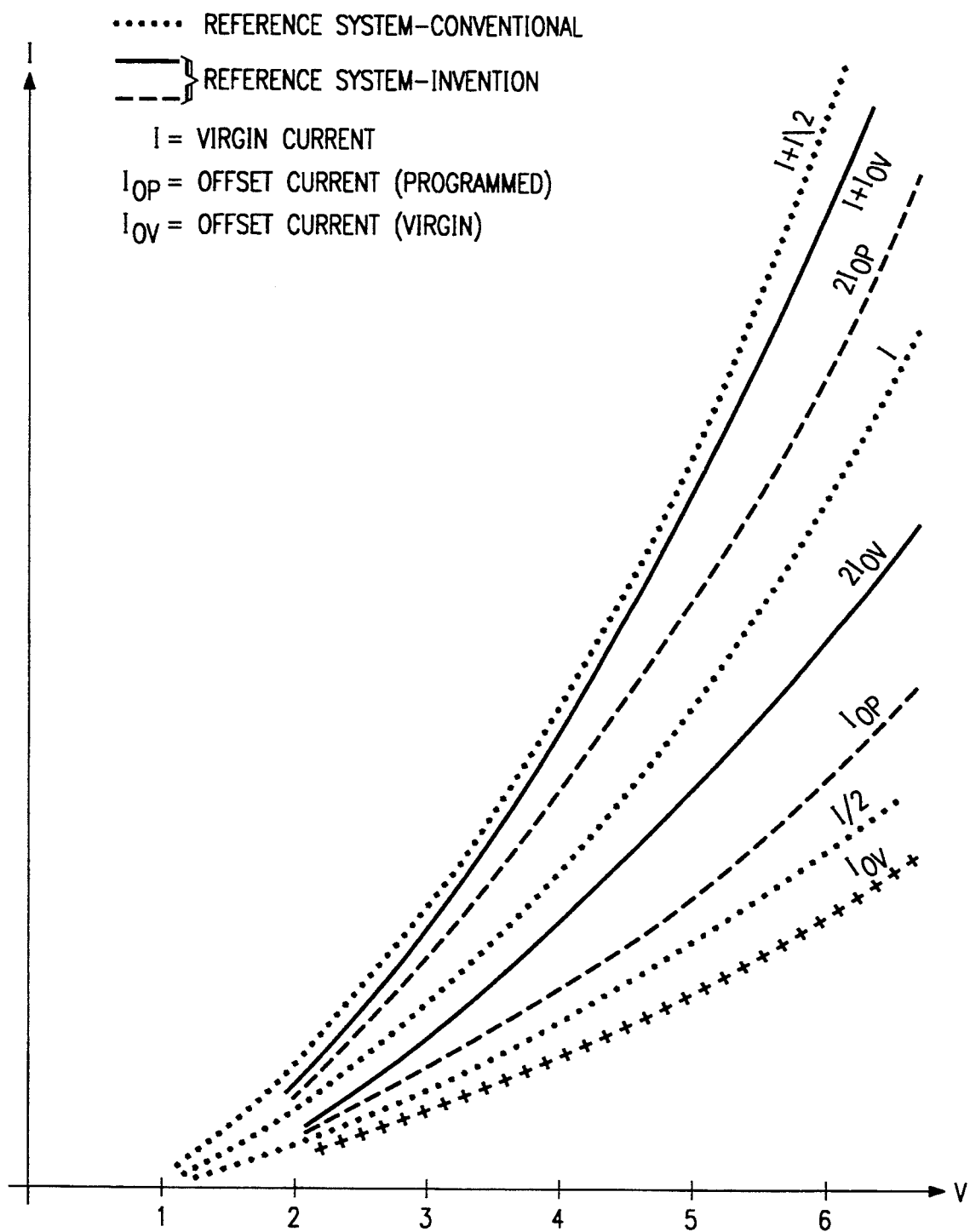
FIG. 9 is a static diagram of the currents, through the loads, relative to the circuits of FIG. 8 and 10, and valid just up to the instant of valuation.

By comparing these last inequalities with those of a traditional system it may be easily observed that these inequalities represent stronger conditions:

$I_{CV} + I_{OV} > 2I_{OV} < - > I + I_{OV} > 2I_{OV}$
for an ON cell for the present system
$I_{CV} + I_{CV}/2 > I_{CV} < - > I + \tfrac{1}{2} > I_{CV}$
for an ON cell for a prior system from:
$I_{OV} < I_{CV}/2 < - > I_{OV} < \tfrac{1}{2}$
follows that: $I_{CV} - I_{OV} > I_{CV} - I_{CV}/2 < - > I - I_{OV} > I - \tfrac{1}{2}$
Similarly:
$I_{OP} < 2I_{OP}$ for an OFF cell with the present system
$I_{CV}/2 < I_{CV} < - > \tfrac{1}{2} < I$ for an OFF cell with a prior art system from;
$I_{OP} > I_{CV}/2 < - > I_{OP} > \tfrac{1}{2}$ it follows that;
$2I_{OP} - I_{OP} > I_{CV} - I_{CV}/2 < - > 2I_{OP} - I_{OP} > I - I/2$ For comparison purposes, the characteristic curves relative to a system, as depicted in FIG. 8, (continuous curves) as well as to those of a system of the prior art (dotted curves) are depicted in FIG. 9. It may be interesting to note that while in a traditional system (dotted curves), the two regions related to ON cells and to OFF cells, respectively, are contiguous and defined by the reference curve I, in the system of the present invention the two regions partially overlap with each other thus giving another visual proof of a substantially "dynamic" behavior of the reference system of the invention, in function of the conductivity of the selected cell, which tends to make the two regions coincident with each other.

However, because the output nodes of two cascode circuits CASM and CASR and the two loads $T_{LM}$ and $T_{LR}$ are equalized through the two equalization transistors Tec and Tel, no appreciable voltage difference may develop across the nodes CM and CR and across $V_M$ and Vr.

Therefore, during the first phase of the reading cycle, the asymmetry is present only in terms of current levels.

Only when the two equalization transistors: Tec, and Tel, are switched off, by switching the respective control signals $\phi$EC and $\phi$EL (which may also be coincident, the potentials of the above mentioned nodes may evolve in a coherent manner in relation to the discrimination being performed.

The inactivation of the two above-mentioned equalization paths through Tec and Tel, besides initiating the enabling of the circuit for reading and storing a datum, initiates also a phase of "dynamical" behavior of the reference system which, through an asymptotic evaluation of the conditions attained by the reference system during the first phase of the reading cycle, enhances the gain and speed of the "sense-amplifier", and increases its immunity to noise.

In fact, the phase-opposition dynamic behavior of the two loads: $T_{LM}$ and $T_{LR}$, by acting on the gates of the offset transistors: $T_{OM}$ and $T_{OR}$, determines an evolution toward its maximum current value by the transistor which acts on the most conductive sensing line, and a correspondent reduction of its minimum conductivity value of the other one of the two asymmetric transistors.

In particular:

1) if an ON cell is selected, then the sensing line with a higher current is the matrix's. Therefore, the $T_{OM}$ current evolves from an initial value $I_{OV}$ to the I value, while the $T_{OR}$ current drops to the 2Imin value (where Imin = f(Vrsl) which depends from the bias value of the sensing line) therefore the inequality:

$$I + I_{OV} > 2I_{OV}$$

evolves and becomes:

$$I + I > 2Imin$$

2) If an OFF cell is selected, then the sensing line with a higher current is the reference line. Therefore the $T_{OR}$ current evolves from an initial value $2I_{OP}$ to the 2I value, while the $T_{OM}$ current drops to the Imin value (where Imin = f($V_M$sl) which depends from the bias value of the sensing line). The inequality:

$$I_{OP} < 2I_{OP}$$

evolves and becomes:

$I_{min} < 2I$.

In both cases, the inequalities are "stronger" than the initial conditions.

As already explained before, such a "dynamic" evolution progresses towards the asymptotes, relative to the initial conditions determined by the reference system. The invention reveals itself particularly advantageous for all those cells which behave somewhat weakly as compared with normal cells in the respective state and which are commonly referred to as "marginal" cells.

For these marginal cells:

$I_V < I_V$-typ for the case of a partially "ON" matrix's cell
$I_P > I_P$-typ for the case of a partially "OFF" matrix's cell where:

$I_V$-typ is the typical current of a virgin cell
$I_P$-typ is the typical current of a programmed cell The response of a "sense-amplifier" to these situations is usually markedly slower than in a normal situation and the slowing down is more marked the greater is the difference from ideal behavior of these cells. Moreover, in these situations, the sense amplifier becomes more sensitive to noise because the levels of current in the two sensing lines get closer together and therefore are less discernible.

The above described dynamic behavior of the reference network of the present invention, by providing for a greater separation between the values of the currents built up by the reference system during the evaluation phase of reading cycle, improves the conditions of discrimination and therefore makes the response of the sense amplifier more uniform.

By virtue of its intrinsic characteristics, the reference system of the invention does not exhibit saturation phenomena. It remains always congruent with the generic current value of a cell and therefore remains valid both at low and at high supply levels.

Advantageously the proposed reference system is also self-compensating.

Usually, in fact, weak programmings (e.g. programmed cells exhibiting a non-null current) produce a so-called marginal behavior of the memory, upon approaching the highest levels of the supply voltage range, because of an intersecting of the "reference" curve with the current characteristics of a programmed cell.

The novel reference system, by employing reference cells in an OFF state in the reference column (line), completely compensates the second inequality, which may be rewritten as:

$I_P + I_{OP} < 2I_{OP} + I_P$ for the case of an "OFF" matrix's cell, which, as may be observed, remains unaltered.

Indeed, when the comparison is carried out with a virgin cell, this compensation is not equally effective because the $I_P$ component does not appear in the first member of the relevant inequality:

$I_C + I_{OV} > 2I_{OV} + I_P$ for the case of an "ON" matrix's cell nevertheless the condition:

$I - I_{OV} > I_P$ which is arrived at by elaborating the preceding inequality, substantially remains always verified, because:

a) the $I_P$ component (when present) manifests itself only at relatively high values of the operating supply voltage range;

b) the disturbance created by $I_P$ could be significant only if it should coincide with a selection of a programmed cell (however it has been already seen that in such a case the disturbance is completely compensated);

c) the value $I_C - I_{OV}$ may be reached only for values far off the normal supply ranges of memory devices and in any case, being ($I_{OV} < I/2$), the condition $I - I_{OV}$ is much stronger than the dual condition: $(\frac{1}{2})I$ which occurs in the sensing circuits of the prior art.

Moreover, the improved conditions of discrimination which are implemented by the novel reference system tolerate a reduced threshold difference between a virgin cell and a programmed cell, as clearly emerges from the preceding considerations.

The advantages in terms of reliability and simplification of the fabrication process are evident.

In defining the inequalities which characterize the behavior of the reference system of the invention according to this second embodiment, the use of a current generator capable of delivering a whole offset current equal to I/2 (half the current of a generic virgin cell) has been hypothesized.

Such a value may be modified according to need in order to alter the relations between the reference curve and the respective characteristics of an ON cell and of an OFF cell.

For example if an equilibrium condition is set for $I_O = (\frac{1}{4})I$ the system of inequalities becomes:

$I_C + I_{OV} > 2I_{OV}$ for the case of an "ON" matrix's cell
$I + I_{OV} > 2I_{OV}$
$I_{OP} < 2I_{OP}$ for the case of an "OFF" matrix's cell because: $I_O = (\frac{1}{4})I < I/2$ It may be deduced that the curves relative to the selection of an ON cell are more spaced than the corresponding curves relative to a selection of an OFF cell. If instead, the equilibrium condition is set as:

$I_O = (\frac{3}{4})I$, the system of inequalities becomes:
$I_C + I_{OV} < 2I_{OV}$ for the case of an ON matrix's cell $I + I_{OV} > 2I_{OV}$ $I_{OP} < 2I_{OP}$ for the case of an OFF matrix's cell. because: $(I_O = (\frac{3}{4})I > \frac{1}{2}$ It may be deduced that the curves relative to the selection of an OFF cell are more spaced than the corresponding curves relative to a selection of an ON cell. In this manner, it is possible to "follow" the progress of the fabrication technology, i.e. by widening the useful region relative to a cell condition under which the process spread of electrical parameters has more influence. The advantage being represented by the opportunity of optimizing the yield of critical (high density) fabrication processes.

An alternative way to realize the reference circuit of the invention for the memory having the unit cells organized in an AND configuration is depicted in FIG. 10.

It should be noted that in this latter embodiment, are the programmed cells are conducting (ON) and vice versa, the virgin cells are non-conducting (OFF). Therefore, the "AND parcels" of the reference sensing line comprise all virgin cells as well as the parcel which acts as current generator. After having made the appropriate corrections, in this different configuration the system of inequalities which has been illustrated above remains valid, as will be evident to a skilled technician.

Also, according to this alternative structural embodiment, the novel reference system of the invention retains its advantages among which the following may be mentioned:

a) simplicity of implementation b) absence of current mirrors or of other distorting networks c) absence of additional dissipating elements;

d) a dynamic behavior during the reading phase which enhances reliability in the presence of marginal cells and/or of noise;

e) self-compensating behavior toward weak programming conditions of the matrix's cells;

f) congruity with the real current passing through the memory cells;

g) validity of the reference system beyond normal application's limits;

Of course, the above considerations substantially applied to the different embodiments depicted in FIGS. 1, 4, 5, 6, 8, 10, and, though in an inverted manner to the circuit shown in FIG. 7, wherein the transistor $T_{OM}$ has a size multiple of the size of the transistor $T_{OR}$.

In all the examples shown, the loads: $T_{LM}$ and $T_{LR}$, of the matrix's side sensing line and of the reference line, respectively, are depicted in a "cross-coupled" configuration, in accordance with what is described in the above-noted prior patent application No. 07/878,823 filed May 4, 1992, whose pertinent description is herewith incorporated by express reference. Nevertheless, such a "cross-coupled" configuration of the loads is not strictly necessary for the purposes of implementing the reference system object of the present invention and the same loads may also be identical diode-configured transistors, according to the well-known prior art techniques, as would be immediately evident to a skilled technician.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

The present invention is particularly advantageous in EPROM and related memory types, but can also be advantageously used in other integrated circuits (particularly microprocessors or electrically programmable logic arrays) which include some nonvolatile memory.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A reference circuit for reading memory cells through a current unbalance between a first current forced through a first sensing line, containing a reference cell, and a second current forced through a second sensing line, containing a memory cell selected for a reading, of an input network of a differential amplifier, wherein each of said two lines is connected to an essentially identical load and wherein a first high impedance amplifying stage circuit has an input connected to said first line and a second high impedance amplifying stage circuit has an input connected to said second line, each of said amplifying circuits generating on a respective output node a signal which is utilized for driving at least a switch connected between a respective load and a source of a bias current forced through said sensing lines, comprising a first transistor functionally connected between said switch driven by the first high impedance amplifying circuit and said source of a bias current and having a control terminal which is connected to said output node of said first high impedance amplifying circuit;

a second transistor functionally connected between said switch driven by said second high impedance amplifying circuit and said source of bias current and having a control terminal which is connected to said output node of said second high impedance amplifying circuit;

said first and second transistors having different sizes from each other and driven by said signals generated on the respective output nodes of said high impedance amplifying circuits superimposing an offset current on said currents which are forced through said identical loads of said two sensing lines of the input network of said differential amplifier.

2. A reference circuit as defined in claim 1, wherein said source of bias current is constituted by a current generator connected between a common source node of said first and second transistors having a size different from each other and a ground node of the circuit.

3. A reference circuit as defined in claim 2, wherein said generator of a bias current delivers a current which is identical to the current of a virgin memory cell.

4. A reference circuit as defined in claim 1, wherein said first transistor has twice the size of said second transistor.

5. A reference circuit according to claim 4, wherein said second transistor has a size identical to the size of transistors constituting said switches.

6. A reference circuit as defined in claim 1, wherein said source of bias current for the load of said first sensing line is constituted by said first transistor, a source of which is connected to a ground node of the circuit and said source of bias current for the load of said second sensing line is constituted by said second transistor, a source of which is connected to said ground node.

7. A reference circuit as defined in claim 1, wherein said memory cells are organized in a NOR configuration.

8. A reference circuit as defined in claim 1, wherein said memory cells are organized in an AND configuration.

9. A reference circuit as defined in claim 1, wherein said reference memory cells are non-conducting.

10. An electrically programmable memory device, comprising a plurality of electrically programmable memory cells in combination with the reference circuit of claim 1.

11. A reference circuit for reading memory cells through a current unbalance between a first current forced through a first sensing line, containing a reference cell, and a second current forced through a second sensing line, containing a memory cell selected for a reading, of an input network of a differential amplifier, wherein each of said two lines is connected to an essentially identical load and wherein a first high impedance amplifying stage circuit has an input connected to said first line and a second high impedance amplifying stage circuit has an input connected to said second line, each of said amplifying circuits generating on a respective output node a signal which is utilized for driving at least a switch connected between a respective load and a source of a bias current forced through said sensing lines, and further comprising a first transistor functionally connected between said switch driven by the first high impedance amplifying circuit and said source of a bias current and having a control terminal which is connected to said second sensing line;
  a second transistor functionally connected between said switch driven by said second high impedance amplifying circuit and said source of a bias current and having a control terminal which is connected to said first sensing line;
  said first and second transistors having different sizes from each other and driven by signals present on the relatively opposite one of said two sensing lines superimposing an offset current on said currents which are forced through said identical loads of said two sensing lines of the input network of said differential sense-amplifier.

12. A reference circuit as defined in claim 11, wherein said source of a bias current is constituted by a current generator connected between a common source node of said first and second transistors having a size different from each other and a ground node of the circuit.

13. A reference circuit as defined in claim 12, wherein said generator of a bias current delivers a current which is identical to the current of a virgin memory cell.

14. A reference circuit as defined in claim 11, wherein said first transistor has twice the size of said second transistor.

15. A reference circuit according to claim 14, wherein said second transistor has a size identical to the size of transistors constituting said switches.

16. A reference circuit as defined in claim 11, wherein a said source of bias current for the load of said first sensing line is constituted by said first transistor, a source of which is connected to a ground node of the circuit and said source of bias current for the load of said second sensing line is constituted by said second transistor, a source of which is connected to said ground node.

17. A reference circuit as defined in claim 11, wherein said memory cells are organized in a NOR configuration.

18. A reference circuit as defined in claim 11, wherein said memory cells are organized in an AND configuration.

19. A reference circuit as defined in claim 11, wherein said reference memory cells are non-conducting.

20. An electrically programmable memory device, comprising a plurality of electrically programmable memory cells in combination with the reference circuit of claim 11.

21. A method for implementing a dynamic reference system for reading memory cells through a current unbalance between a first current forced through a first sensing line, containing a reference cell, and a second current forced through a second sensing line, containing a memory cell selected for a reading, of an input network of a differential amplifier, wherein each of said two lines is connected to an essentially identical load and wherein a first high impedance amplifying stage circuit has an input connected to said first line and a second high impedance amplifying stage circuit has an input connected to said second line, each of said amplifying circuits generating on a respective output node a signal which is utilized for driving at least a switch connected between a respective load and a source of a bias current forced through said sensing lines bias current, which comprises utilizing said signals generated on the respective output nodes by said high impedance amplifying circuits for driving two asymmetric transistors respectively which are functionally connected between said switches, respectively and said bias current source and have different sizes from each other, for superimposing an offset current on said currents forced through the loads of said sensing lines.

22. A method for implementing a dynamic reference system for reading memory cells through a current unbalance between a first current forced through a first sensing line, containing a reference cell, and a second current forced through a second sensing line, containing a memory cell selected for a reading, of an input network of a differential amplifier, wherein each of said two lines is connected to an essentially identical load and wherein a first high impedance amplifying stage circuit has an input connected to said first line and a second high impedance amplifying stage circuit has an input connected to said second line, each of said amplifying circuits generating on a respective output node a signal which is utilized for driving at least a switch connected between a respective load and a source of a bias current forced through said sensing lines and which comprises utilizing a signal present on the connection node to the respective load of said first sensing line for driving a first asymmetric transistor functionally connected between said switch and said bias current source of said second sensing line;
  utilizing a signal present on the connection node to the respective load of said second sensing line for driving a second asymmetric transistor functionally connected between said switch and said bias current source of said first sensing line;
  said first and second asymmetric transistors having different sizes from each other.

23. An integrated circuit memory, comprising:
  a plurality of reference cells each programmed to a known state, and each connected to a reference bit line;
  a sense amplifier comprising
    a matrix side connectable to a selected one of said matrix bit lines, and a reference side connectable to said reference bit line, each said side including:
      an input node connectable to said respective bit line;
      an amplifier having its input connected to said input node;
      an offset transistor connected to provide a controlled current to said input node from a first power supply node;
      a pass transistor connected between said input node and an output node, and connected to be driven by said amplifier;
      a load element, connected to provide a controlled current to said output node from a second power supply node;

wherein said offset transistor of said matrix side and said offset transistor of said reference side have respective sizes which are unequal;

equalization logic connected to equate the potential of at least a portion of said first side to the potential of a corresponding portion of said second side, when an equalization signal is input thereto; and a differential amplifier connected to receive said output nodes of said first and second sides of said sense amplifier, and configured to provide a corresponding output signal.

24. The integrated circuit of claim 23, further comprising selection logic configured to connect said sense amplifier to only a selected one of said matrix bit lines.

25. The integrated circuit of claim 23, wherein said equalization logic comprises a first equalization transistor connected to equalize said output nodes, and a second transistor connected to equalize the gate potentials of said pass transistors.

26. The integrated circuit of claim 23, wherein said load elements of said first and second sides are mutually cross-coupled transistors.

27. The integrated circuit of claim 23, wherein said offset transistor of said matrix side is substantially twice as wide as said offset transistor of said reference side.

28. The integrated circuit of claim 23, wherein said offset transistor of said reference side is substantially twice as wide as said offset transistor of said matrix side.

29. The integrated circuit of claim 23, wherein said current source consists essentially of a transistor which is matched to said transistors of said matrix cells, and which has a respective gate thereof connected to a positive power supply node.

30. The integrated circuit of claim 23, wherein said memory cells each comprise EEPROM (electrically erasable programmable read-only memory) cells.

31. The integrated circuit of claim 23, wherein said memory cells each comprise EPROM (erasable programmable read-only memory) cells.

32. An integrated circuit memory, comprising:

a matrix of memory cells, each comprising a variable-threshold transistor which is connected to be accessed by a row line and which, when turned ON, conducts current from a respective matrix bit line to ground;

a reference bit line, and a plurality of reference cells each comprising a variable-threshold transistor which is programmed to a known state, and which is connected, in common with cells of said matrix, to be accessed by a respective row line;

a sense amplifier comprising a matrix side connectable to a selected one of said matrix bit lines, and a reference side connectable to said reference bit line, each said side including:

an input node connectable to said respective bit line;

an amplifier having its input connected to said input node;

a field-effect offset transistor connected to sink a controlled current to said input node; said offset transistors of said first and second sides having respective sizes which are unequal;

a field-effect pass transistor connected between said input node and an output node, and connected to be driven by said amplifier; and a load element, connected to source a controlled current to said output node;

a current source connected to supply a controlled current to both said offset transistors;

equalization logic connected to conditionally equalize the potentials of said output nodes of both said sides; and a differential amplifier connected to receive said output nodes of said first and second sides of said sense amplifier, and configured to provide a corresponding output signal.

33. The integrated circuit of claim 32, further comprising selection logic configured to connect said sense amplifier to only a selected one of said matrix bit lines.

34. The integrated circuit of claim 32, wherein said equalization logic comprises a first equalization transistor connected to equalize said output nodes, and a second transistor connected to equalize the gate potentials of said pass transistors.

35. The integrated circuit of claim 32, wherein said load elements of said first and second sides are mutually cross-coupled transistors.

36. The integrated circuit of claim 32, wherein said offset transistor of said matrix side is substantially twice as wide as said offset transistor of said reference side.

37. The integrated circuit of claim 32, wherein said offset transistor of said reference side is substantially twice as wide as said offset transistor of said matrix side.

38. The integrated circuit of claim 32, further comprising a current source connected to provided a substantially predetermined total current from said second power supply node to said first and second offset transistors in parallel.

39. The integrated circuit of claim 32, wherein said memory cells each comprise EEPROM (electrically erasable programmable read-only memory) cells.

40. The integrated circuit of claim 32, wherein said memory cells each comprise EPROM (erasable programmable read-only memory) cells.

* * * * *